United States Patent [19]

Bernstein

[11] Patent Number: 5,501,003
[45] Date of Patent: Mar. 26, 1996

[54] METHOD OF ASSEMBLING ELECTRONIC PACKAGES FOR SURFACE MOUNT APPLICATIONS

[75] Inventor: Elliot Bernstein, Glen Cove, N.Y.

[73] Assignee: Bel Fuse Inc., Jersey City, N.J.

[21] Appl. No.: 167,420

[22] Filed: Dec. 15, 1993

[51] Int. Cl.⁶ .................................................. H01R 43/00
[52] U.S. Cl. ................................. 29/827; 29/830; 29/831; 29/854; 29/855; 361/784
[58] Field of Search ............................ 29/827, 830, 831, 29/854, 855; 259/668; 361/813, 784, 785; 439/74, 75, 76

[56] References Cited

U.S. PATENT DOCUMENTS

| 3,271,625 | 9/1966 | Caracciolo | 29/827 |
| 4,089,733 | 5/1978 | Zimmerman | 29/827 |
| 4,751,611 | 6/1988 | Arai et al. | 361/813 |
| 5,168,368 | 12/1992 | Gow, III et al. | 257/668 |
| 5,210,936 | 5/1993 | Simmons et al. | 29/827 |

FOREIGN PATENT DOCUMENTS

| 59-107064 | 7/1982 | Japan | 257/668 |
| 63-211657 | 9/1988 | Japan | 257/668 |
| 2-89389 | 3/1990 | Japan | 439/76 |
| 4-291984 | 10/1992 | Japan | 361/784 |
| 5-21703 | 1/1993 | Japan | 257/668 |

Primary Examiner—P. W. Echols
Attorney, Agent, or Firm—Ostrolenk, Faber, Gerb & Soffen

[57] ABSTRACT

The method is used to assemble an electronic package of the type having a plurality of external conductive output pads for subsequent surface mounting of the electronic package. The method includes forming a nonconductive frame within the opening of a conductive lead frame such that the nonconductive frame is attached to and encapsulates a portion of each of the leads of the conductive lead frame. An electronic package, which includes two printed circuit boards, having components and conductive output areas on respective sides thereof, is positioned within the non-conductive frame from opposite sides and the conductive output areas of the boards attached to respective parts of different ones of the leads of the conductive lead frame. The electronic package is then encapsulated, leaving an air gap between the boards which cushions and isolates the internal solder joints from subsequent stress by allowing the boards to flex. The leads of the conductive lead frame are then separated from the frame.

10 Claims, 5 Drawing Sheets

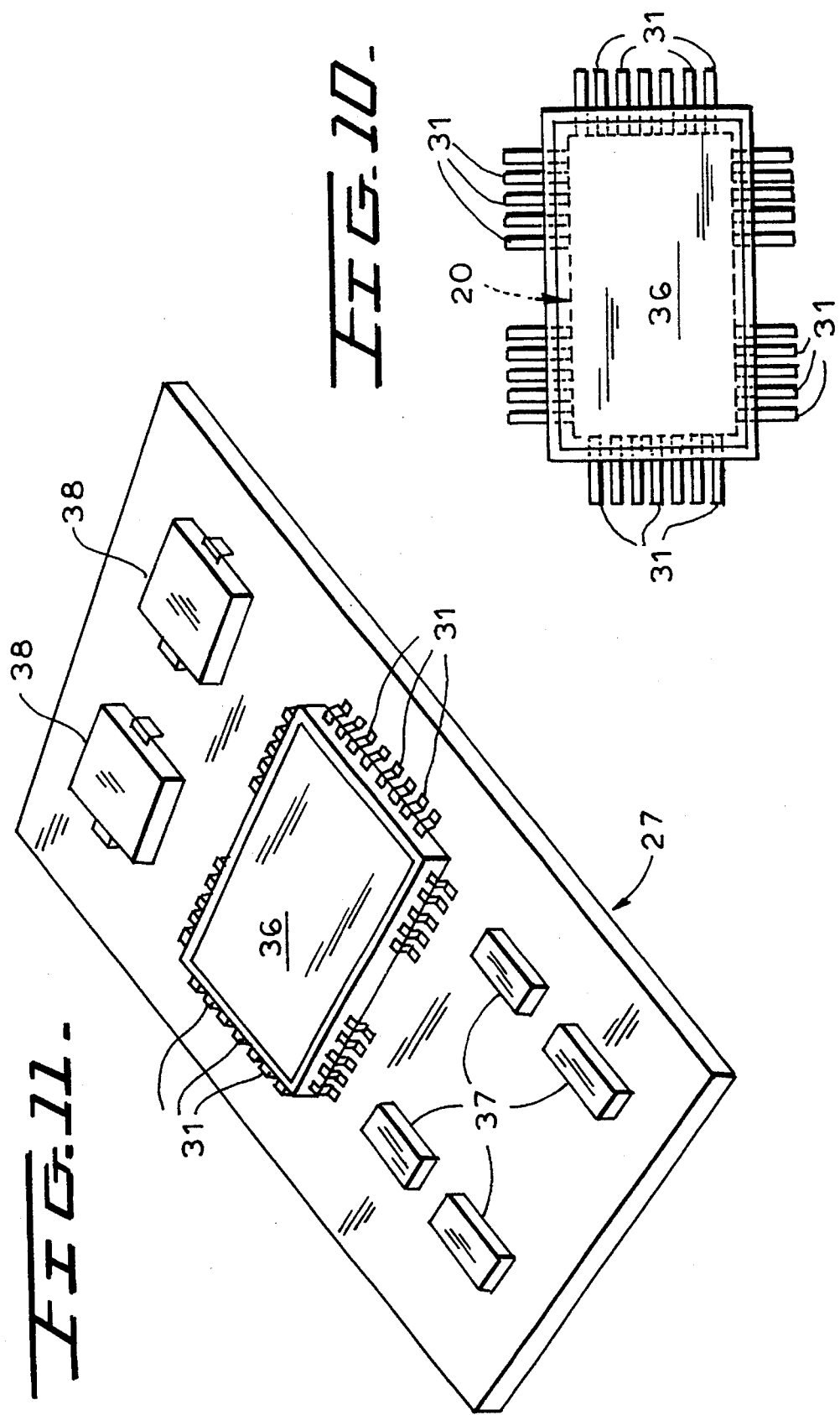

METHOD OF ASSEMBLING ELECTRONIC PACKAGES FOR SURFACE MOUNT APPLICATIONS

BACKGROUND OF THE INVENTION

This invention relates to a method of assembling electronic packages and, more particularly, to a method of assembling electronic packages for surface mount applications.

As the demand for more efficient manufacturing methods and denser packaging of electronic products grows, more and more manufacturers are turning to mounting the required components in what is known as surface mount technology, rather than using traditional leaded components fed through holes in a printed circuit board and wave soldered on the bottom of the board. In surface mount technology processing, solder pastes are screened on a printed circuit board (generally referred to as a master board since the components being soldered may themselves include printed circuit boards), components are placed with their leads in the paste and the entire master board is brought to the melting temperature of the solder paste to thereby solder all the components to the board.

For discreet components such as integrated circuits, capacitors, resistors etc., the soldering process and the high temperatures involved are not destructive. However, for packaged sub-circuits, such as delay lines, filters or other assemblies that consist of a multitude of individual components, the soldering temperature used to reflow the pastes on the master board may reflow pastes used in the packaged assembly causing internal shorts or open circuits. The technique used to overcome this problem is to use solder pastes in the packaged circuit that have a higher melting temperature than the temperature used to reflow the solder pastes on the master board. This technique is reasonably successful. However, it has been found that because of the differences of thermal expansion of the encapsulating materials used to package the sub-circuits and the components and solder joints within the sub-circuit, tremendous pressures are exerted on encapsulated components and solder joints. These pressures can be great enough to flatten out or extrude internal solder joints causing shorts or opens.

SUMMARY OF THE INVENTION

Accordingly, it is an object of the present invention to provide a method of assembling electronic packages for surface mount applications which overcomes the foregoing problems while at the same time providing the same degree of protection to components within the package.

In accordance with the present invention, the foregoing and other objects are achieved by a method which employs a conductive lead frame having four sides defining a first opening and having a plurality of leads extending into the first opening. Each of the leads has one end attached to one of the sides and a second end extending into the first opening. A nonconductive frame is formed within the first opening, the nonconductive frame being attached to each of the leads intermediate the first and second ends thereof and defining a second opening within the first opening. The first and second openings have peripheral dimensions greater than the peripheral dimensions of the electronic package, and the leads of the conductive lead frame extend into the second opening. The electronic package is then positioned within the second opening and the conductive output areas thereof conductively attached to different ones of the leads in the second opening. Thereafter, the electronic package is encapsulated and the four sides of the lead frame severed from the first ends of the leads.

In a preferred embodiment, the electronic package comprises two printed circuit boards having components on only one side along with conductive output areas. The boards are positioned within the second opening from opposite sides of the conductive lead frame in a face-to-face relationship, and the conductive output areas of the boards are then attached to opposite sides of different ones of the leads in the second opening. The electronic package is then encapsulated and the four sides of the conductive lead frame severed from the first ends of the leads.

One of the features of the present invention is that the components are surrounded by air after encapsulation. Such air space serves to cushion and isolate the internal solder joints from any subsequent stress. Any stresses that might otherwise be imposed on internal solder connections of the package are relieved by flexing of the encapsulated package. Additionally, the non-conductive frame serves to isolate and insulate the electronic package from the environment thereby enabling thinner and more flexible printed circuit boards and encapsulating layers to be employed.

Other objects, features and advantages of the present invention will become apparent from the following description of the invention which refers to the accompanying drawings.

BRIEF DESCRIPTION OF THE DRAWINGS

FIG. 10 is a plan view of the electronic package of FIGS. 8 and 9 after severing of the leads from the lead frame.

FIG. 11 is a perspective view of the electronic package of FIG. 10 surface mounted to a master printed circuit board.

DETAILED DESCRIPTION OF THE INVENTION

Figure 1:
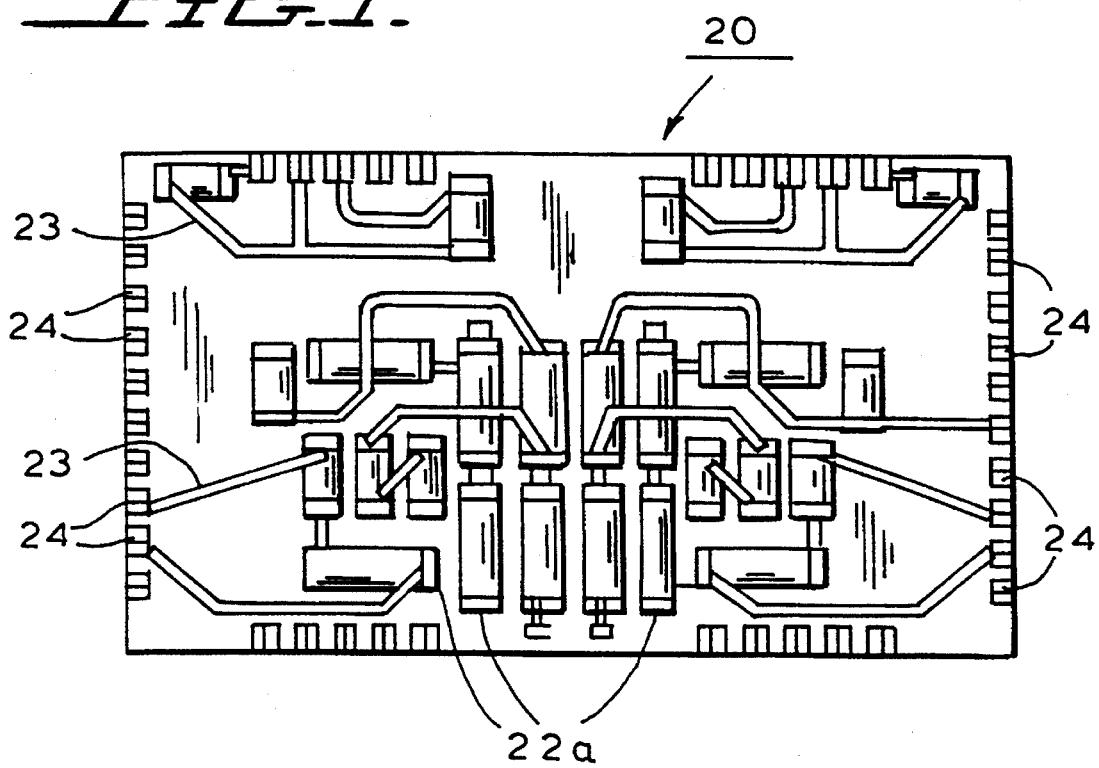
FIGS. 1 and 2 are plan views of printed circuit boards forming an electronic package or sub-circuit which is to be assembled for surface mount application in accordance with the present invention.
Figure 2:
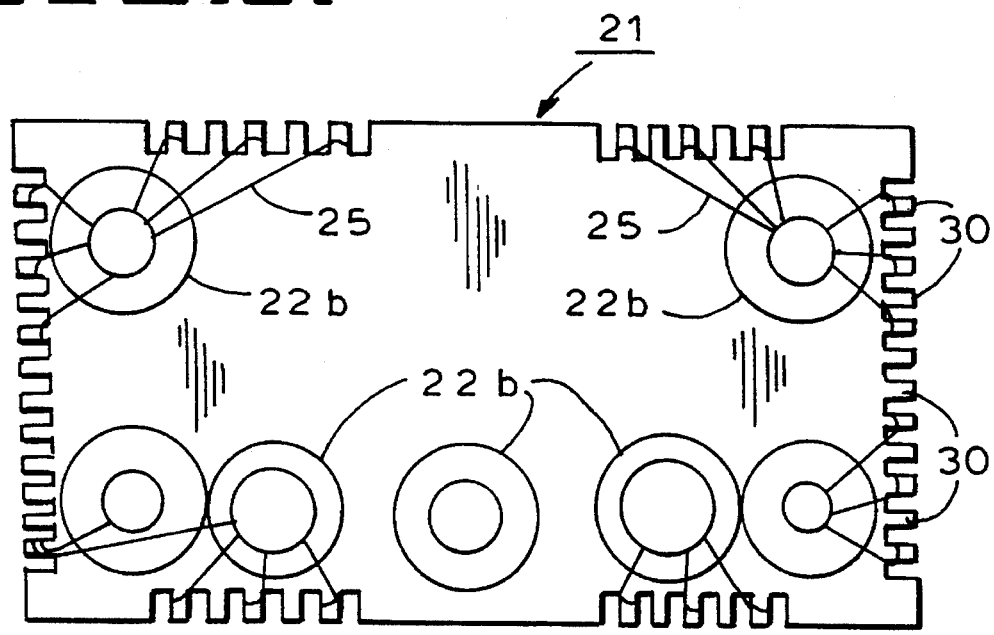

Referring now to the drawings and, particularly, to FIGS. 1 and 2, there are shown first and second printed circuit boards 20 and 21 containing electronic components 22, such as resistors 22a and wound components 22b. The resistors 22a are interconnected by their leads 23 which, in turn, are soldered to respective ones in peripheral output pads 24.

Alternatively, as is conventional, the resistors 22a, or other types of components 22, may be interconnected with printed conductive paths (not shown) on the board 20. In the case of the wound components 22b, leads 25 from the components 22 are wound around tabs 30 formed about the periphery of the board 21. After winding, the wound portions of the leads 25 are soldered. In order to avoid any possible shorting of a component 22c resulting from bridging of solder from one wound tab 30 to another wound tab 30, at least one tab intermediate one wound tab and the next nearest wound tab is left unwound.

In accordance with the present invention, the boards 20 and 21, which together represent a sub-circuit, such as delay line, are to be assembled with a conventional conductive lead frame 26 (shown in FIG. 3) for subsequent surface mounting to a master printed circuit board 27 (FIG. 11).

Figure 3:
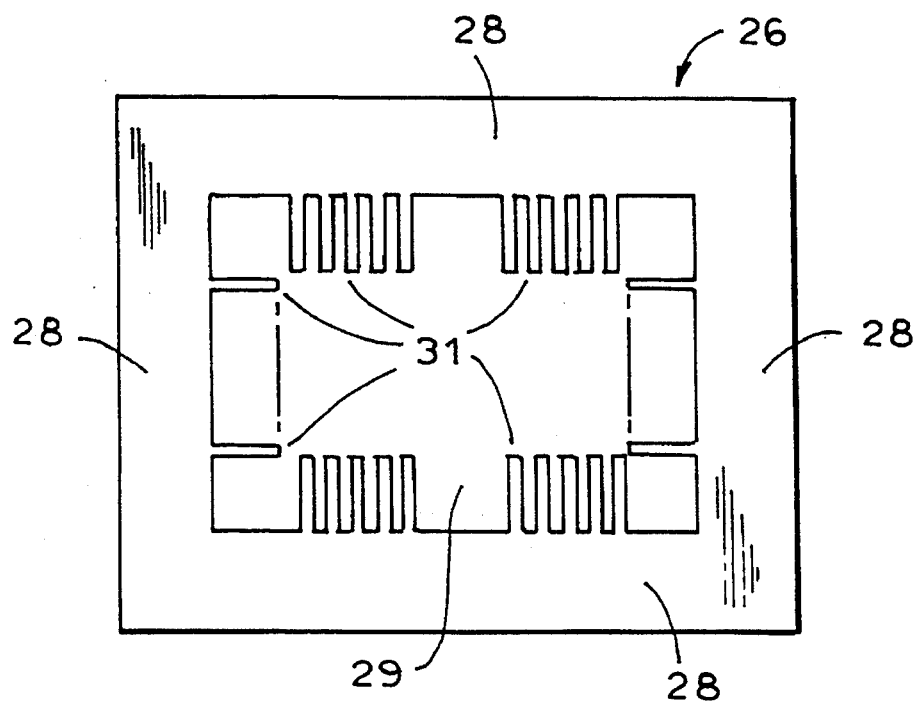
FIG. 3 is a plan view of a conductive lead frame.

Turning now to FIG. 3, the lead frame 26 includes four sides 28 defining an inner opening 29. A plurality of leads 31 extend from at least two of the opposite sides 27 into the opening 29. Generally, however, leads 31 will extend into the opening 29 from all four sides. The number of leads 31 and their positioning generally correspond to the number and positioning of the output areas 24 of the boards 20 and 21.

Figure 4:
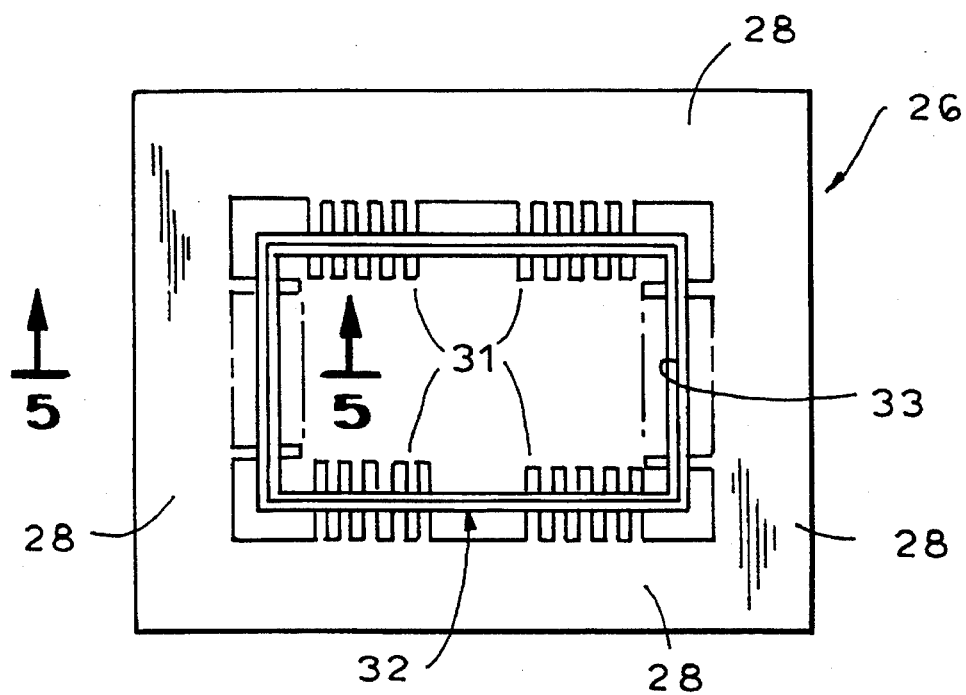
FIG. 4 is a plan view of the conductive lead frame of FIG. 3 having a non-conductive frame formed thereon in accordance with a first step of the present inventive method.
Figure 5:
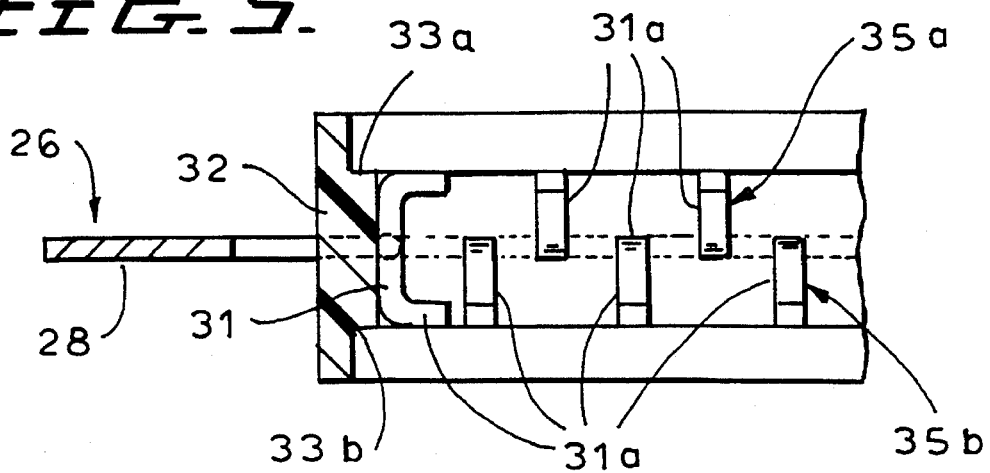
FIG. 5 is cross-sectional, elevational view taken along the lines 5—5 of FIG. 4.

As shown in FIGS. 4 and 5, the next step in assembling the boards 20, 21 to the lead frame 26, is to form a nonconductive frame 32, having an opening 33, within the opening 29 of the conductive lead frame 26. More specifically, the nonconductive frame 32 fully surrounds each of the leads 31 and encapsulates the portions of the leads which it surrounds. Like the opening 29, the peripheral dimensions of the opening 33 are larger than the peripheral dimensions of the boards 20, 21. The opening 33 is stepped from both the top and bottom surfaces to form respective upper and inner ledges 33a and 33b respectively. Typically, the nonconductive frame 32 is made of a non-conductive material with a melting point higher than the temperatures reached in subsequent soldering and, illustratively, may be either a moldable or castable non-conductive material, such as epoxy.

The ends of the leads 31 are crimped, as shown in FIG. 5, to form offset portions 31a with the offset portions 31a of a first group 35a of the leads 31 offset, in a first direction from the lead frame 26 and with the offset portions 31a of a second group 35b of the leads 31 offset in an opposite direction. This may be done either before or after forming the nonconductor frame 32.

Figure 7:
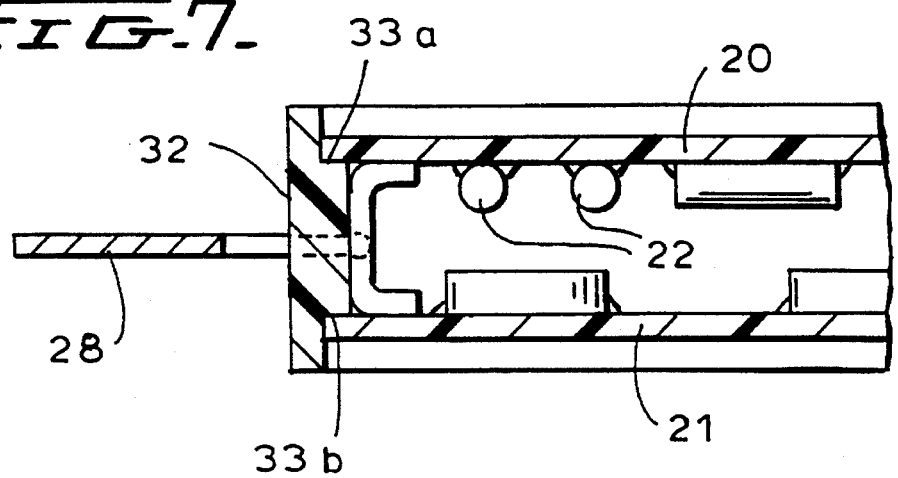
FIG. 7 is a cross-sectional, elevational view taken along the lines 7—7 of FIG. 6.
Figure 6:
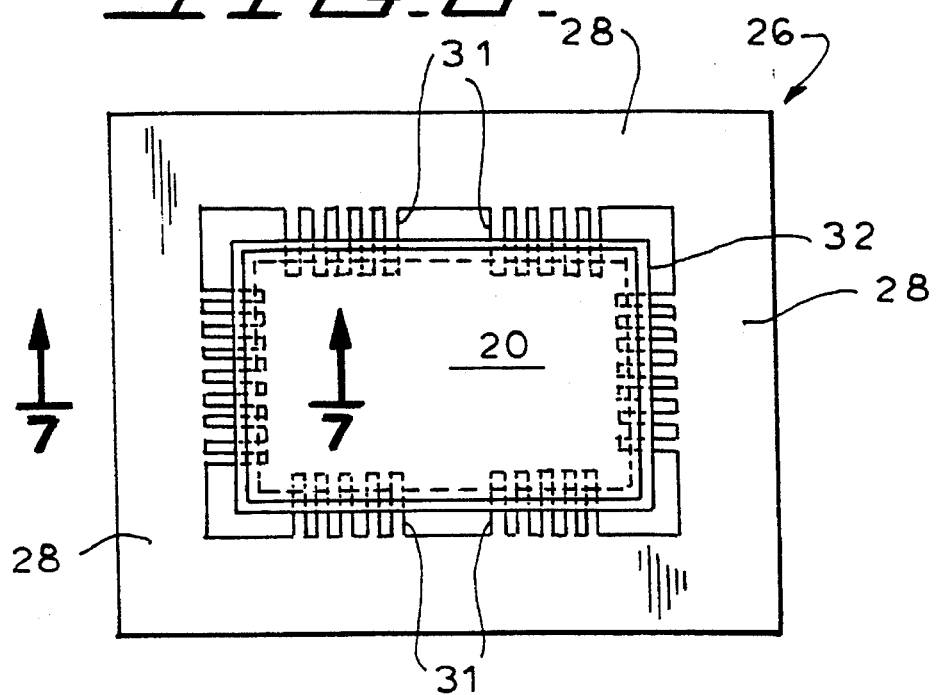
FIG. 6 is a plan view of the conductive lead frame of FIGS. 4 and 5 after positioning of the boards of FIGS. 1 and 2 with the non-conductive frame and subsequent soldering of conductive pads on the boards to the leads of the lead frame.

As seen in FIGS. 6 and 7, the boards 20 and 21 are then positioned within the opening 33 on the ledges 33a and 33b, respectively, in a face-to-face relationship with the conductive output areas (i.e., pads 24 and/or wound tabs 30) of one board in contact with the top sides of the offset portions 31a of the first group 35a of leads 31, and with the conductive output areas of the other board in contact with the bottom sides of the offset portions 31a of the second group 35b of the leads 31. The output pads 24 and wound tabs 30 are then soldered to their respective offset portions 31a by any conventional mass soldering process. Preferably, soldering is effected by a reflow process in which each of the output pads 24 and wound tabs 30 on the printed circuit boards 20 and 21 is first coated with solder paste prior to assembly with the lead frame 26, and then the assembly of the two boards 20 and 21 and the lead frame 26 brought to the melting temperature of the solder paste.

Figure 9:
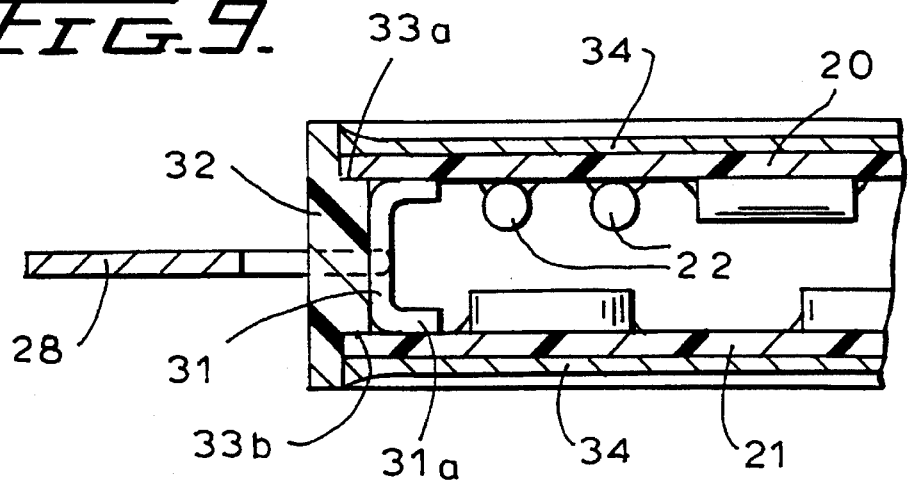
FIG. 9 is a cross-sectional, elevational view taken along the lines 9—9 of the assembly of FIG. 8.
Figure 8:
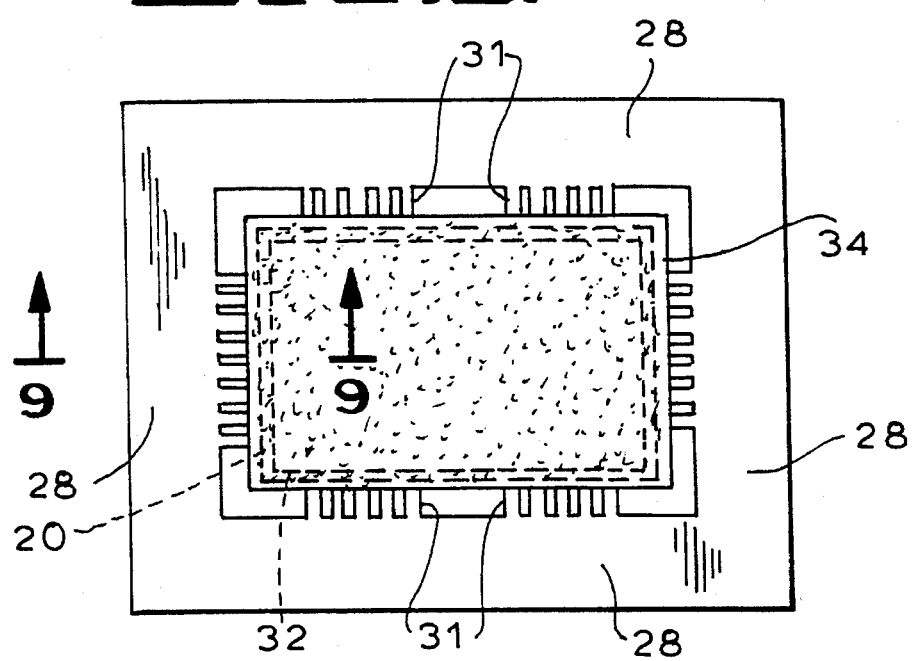
FIG. 8 is a plan view of the assembly of FIGS. 6 and 7 after encapsulation.

A thin coating 34 of insulating material, such as an ultraviolet curable epoxy, is then applied around the respective printed wiring boards by any suitable process, such as spraying, brushing or pouring. The resulting package is as shown in FIGS. 8 and 9. The four sides 28 of the lead frame 26 are removed by any conventional cutting or severing process leaving, as shown in FIG. 10, an encapsulated package 36 having extended leads 28. Thereafter, as shown in FIG. 11, the package 36 may be surface mounted, along with other components 38, to conductive pads 37 formed on the master board 27 by a conventional mass soldering technique, such as reflow soldering.

As best seen in FIG. 9 because of the face-to-face relationship of the individual components 22 of the packaged sub-circuit 36, after encapsulation the components 22 are surrounded by an air space. Accordingly, they are thereby not subject to stresses resulting from any thermal expansion of the encapsulating coating 34 which may occur during subsequent soldering. Additionally, by selecting thin, flexible materials for the encapsulating coating 34 and the boards 20 and 21 used in the sub-circuit, any internal pressure created during the soldering of the package 36 to the master board 27 will be directed to a bellows effect as the boards 20, 21 flex, rather than to pressure on the internal solder joints. Advantageously, in order to assure hermetic encapsulation of the components, the air space between the boards may be filled with a soft material, like silicone, which will still allow the boards 20, 21 to flex.

An additional advantage of the inventive method is the ability to take advantage of the inherent property of a solder connection to retain its original shape and location even though it is remelted, that is, to take advantage of the capillary action of the solder, as long as no pressure is applied during the solder's liquid stage. This eliminates the need to resort to extremely high melting solder for the packaged sub-circuit that in itself can create problems during the assembly of the sub-circuit.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of assembling an electronic package of the type having first and second printed circuit boards, each of which has discrete components and conductive output areas on one side thereof for subsequent surface mounting of the electronic package, which method comprises:

(a) providing a conductive lead frame having a plurality of sides defining a first opening, the lead frame further having a plurality of leads extending into the first opening, each of the leads having first and second sides, one end of each lead being attached to one of the sides of the lead frame and a second end of each lead extending into the first opening;

(b) forming a nonconductive frame within the first opening, the nonconductive frame being attached to each of the leads intermediate the first and second ends thereof and defining a second opening within the first opening, the first and second openings having peripheral dimensions greater than the peripheral dimensions of the electronic package, and the leads of the conductive lead frame extending into the second opening;

(c) positioning the electronic package within the second opening such that the first and second boards are supported on the nonconductive frame, the components of the first board are spaced from and face the components of the second board, the conductive output areas of the first board are in contact with the first sides of a first group of the leads and the conductive output areas of the second board are in contact with the second sides of a second group of the leads;

(d) conductively attaching the conductive output areas of the electronic assembly to different ones of the leads in the second opening;

(e) encapsulating the electronic package; and (f) severing the sides of the conductive lead frame from the first ends of the leads.

2. The method of claim 1, wherein the respective second ends of the leads are crimped to form respective offset portions prior to step (c) and the conductive output areas are attached to different ones of the offset portions.

3. The method of claim 1, wherein the respective second ends of the first group of leads are crimped to form respective offset portions offset in a first direction from the lead frame and the respective second ends of the second group of leads are crimped to form respective offset portions offset in a second direction, opposite to the first direction, from the lead frame.

4. A method of assembling an electronic package of the type having first and second printed circuit boards, each of which has discrete components and conductive output areas on one side thereof for subsequent surface mounting of the electronic package, which method comprises:

(a) providing a conductive lead frame having a plurality of sides defining a first opening, the lead frame further having a plurality of leads extending into the first opening, each of the leads having first and second sides one, end of each lead being attached to one of the sides of the lead frame and a second end of each lead extending into the first opening;

(b) forming a nonconductive frame with oppositely facing ledges within the first opening, the nonconductive frame being attached to each of the leads intermediate the first and second ends thereof and defining a second opening within the first opening, the first and second openings having peripheral dimensions greater than the peripheral dimensions of the electronic package, and the leads of the conductive lead frame extending into the second opening;

(c) positioning the electronic package within the second opening such that the first and second boards are supported on the first and second ledges, respectively, of the lead frame, the components of the first board face the components of the second board, the conductive output areas of the first board are in contact with the first sides of a first group of the leads and the conductive output areas of the second board are in contact with the second sides of a second group of the leads;

(d) conductively attaching the conductive output areas of the electronic assembly to different ones of the leads in the second opening;

(e) encapsulating the electronic package; and (f) severing the sides of the conductive lead frame from the first ends of the leads.

5. The method of claim 4, wherein at least some of the components are wound components.

6. The method of claim 5, wherein at least one of the boards has tabs on at least one side and the wound components have leads which are wound around respective tabs to form conductive output areas for the wound components.

7. The method of claim 6, wherein the wound tabs are soldered.

8. The method of claim 7, wherein at least one blank tab is provided intermediate any two adjacent wound tabs.

9. The method of claim 8, wherein a soft material is introduced into the space between the facing sides of the first and second printed circuit boards.

10. The method of claim 9, wherein the soft material is silicone.

* * * * *